(12) United States Patent
Imaeda et al.

(10) Patent No.: US 7,927,981 B2
(45) Date of Patent: Apr. 19, 2011

(54) APPARATUS FOR DEPOSITING SILICON-BASED THIN FILM AND METHOD FOR DEPOSITING SILICON-BASED THIN FILM

(75) Inventors: Minoru Imaeda, Ichinomiya (JP); Yuichiro Imanishi, Nagoya (JP); Takao Saito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 112 days.

(21) Appl. No.: 12/411,507

(22) Filed: Mar. 26, 2009

(65) Prior Publication Data
US 2009/0246942 A1 Oct. 1, 2009

(30) Foreign Application Priority Data
Mar. 31, 2008 (JP) .................................. 2008-091402

(51) Int. Cl.
H01L 21/00 (2006.01)
H01L 21/31 (2006.01)
H01L 21/469 (2006.01)
(52) U.S. Cl. .. 438/485; 438/771; 438/788; 257/E21.269
(58) Field of Classification Search .................. 438/478, 438/485, 771, 772, 788; 257/E21.269
See application file for complete search history.

(56) References Cited

U.S. PATENT DOCUMENTS
2002/0056415 A1  5/2002  Mashima et al.
2004/0161534 A1* 8/2004  Saito et al. ................. 427/249.1

FOREIGN PATENT DOCUMENTS
JP  2000-223424 A1  8/2000

* cited by examiner

Primary Examiner — Alexander G Ghyka
Assistant Examiner — Seahvosh J Nikmanesh
(74) Attorney, Agent, or Firm — Burr & Brown

(57) ABSTRACT

A silicon-based thin film depositing apparatus, including a plurality of transparent electrodes disposed to face corresponding counter electrodes with a space therebetween. Subsequently, while injecting a raw material gas from raw material gas injection orifices toward the supporting electrodes and also injecting a barrier gas from barrier gas injection orifices in the same direction as the direction in which the raw material gas is injected, the gases are discharged from a gas outlet, and thereby, the pressure in a chamber is controlled to a pressure of more than 1 kPa. Then, a DC pulse voltage is applied to each counter electrode to deposit a silicon-based thin film. A DC pulse voltage is applied to perform discharge. Therefore, even in a state where the distance between the electrodes is increased, plasma can be generated efficiently, and the in-plane distribution of film thickness can be improved.

4 Claims, 4 Drawing Sheets

APPARATUS FOR DEPOSITING SILICON-BASED THIN FILM AND METHOD FOR DEPOSITING SILICON-BASED THIN FILM

BACKGROUND OF THE INVENTION

1. Field of the Invention

The present invention relates to an apparatus for depositing a silicon-based thin film and a method for depositing a silicon-based thin film.

2. Description of the Related Art

Silicon-based thin films are expected to be used for promising solar cells in view of constraints of silicon resources, etc. With respect to amorphous silicon thin films which have been used to date, solar cells with a conversion efficiency of about 8% have been put into practical use. Recently, tandem solar cells having structures in which amorphous silicon and thin film crystalline silicon are stacked on one another have been developed. In these tandem cells, by using solar light in a wide wavelength range, photovoltaic power generation with a conversion efficiency of about 15% is becoming possible. As a method for forming such thin-film structures, decomposition and deposition of a silane-based gas using a PECVD (Plasma Enhanced Chemical Vapor Deposition) apparatus are generally performed. Amorphous silicon are required to have a thickness of about several hundred nanometers, and thin film crystalline silicon are required to have a thickness of about several thousand nanometers. Consequently, in order to achieve both high film deposition ratio and good film thickness uniformity, various proposals have been made regarding PECVD apparatuses.

For example, in low pressure PECVD at a pressure of 1 kPa or less, in order to achieve high deposition ratio and improve film thickness distribution on a large-area substrate, methods in which a radio frequency voltage is intermittently applied to perform discharge (short pulse VHF PECVD method) have been employed in recent years. Japanese Patent No. 3420960 discloses an example of short pulse VHF PECVD method, in which two pairs of cathode and anode electrodes are provided in a chamber, a base material on which a film is formed is placed on each cathode electrode set at a ground potential, a mixed gas of silane and hydrogen is introduced into the chamber, and short pulse VHF waves are applied to the individual anode electrodes so that their ON periods do not coincide with each other, thereby depositing silicon-based thin films on the base materials. The discharge is carried out under the following conditions: frequency of VHF voltage: 27.12 MHz, ON period of modulated pulse: 10 μsec, duty ratio: 20%, and shift of ON periods: 25 μsec.

SUMMARY OF THE INVENTION

In formation of silicon-based thin films using radical species, it is necessary to increase the distance between the cathode electrode and the anode electrode compared with the case of formation of films, such as diamond like carbon (DLC) films, using ionic species.

However, in a short pulse VHF PECVD method, at a pressure of more than 1 kPa, it has been very difficult to achieve both an increase in the distance between electrodes and in-plane uniformity of film thickness in deposition of silicon-based thin films.

The present invention has been made in view of the problems described above, and main objects of the present invention are to provide a silicon-based thin film depositing apparatus in which both an increase in the distance between electrodes and in-plane uniformity of film thickness can be achieved when a silicon-based thin film is deposited at a pressure of more than 1 kPa, and to provide a method for depositing a silicon-based thin film.

In order to achieve at least one of the objects described above, the present invention adopts the means described below.

The present invention provides a silicon-based thin film depositing apparatus which deposits a silicon-based thin film on a film formation portion, including: a supporting electrode which is provided in a chamber and capable of supporting the film formation portion; a counter electrode provided so as to face the supporting electrode with a space therebetween; a DC pulse voltage application circuit which applies a DC pulse voltage between the counter electrode and the supporting electrode; a raw material gas injection orifice which injects a raw material gas for depositing the silicon-based thin film from a surface of the counter electrode toward the supporting electrode; and a barrier gas injection orifice which injects a barrier gas in the same direction as the direction in which the raw material gas is injected, so as to surround the raw material gas injected toward the supporting electrode from the surface of the counter electrode, the barrier gas being different from the raw material gas.

In the silicon-based thin film depositing apparatus, first, the film formation portion is supported by the supporting electrode so that a space is formed between the surface of the film formation portion and the counter electrode. Then, the internal pressure of the chamber is controlled to a pressure of more than 1 kPa, and while injecting the raw material gas from the raw material gas injection orifice and also injecting the barrier gas from the barrier gas injection orifice, a DC pulse voltage is applied between the counter electrode and the supporting electrode by the DC pulse voltage application circuit to generate plasma. Thereby, a silicon-based thin film is deposited on the film formation portion. In this method, a DC pulse voltage is applied to perform discharge as described above. Therefore, in comparison with short pulse VHF PECVD method, even in a state where the distance between the electrodes is increased (e.g., to 5 mm or more), plasma can be generated efficiently, and the in-plane distribution of film thickness can be improved. Furthermore, by injecting the barrier gas so as to surround the raw material gas, plasma is prevented from diffusing in the lateral direction between the film formation portion and the counter electrode. Moreover, when a carrier gas, such as helium gas, is mixed with the raw material gas, the flow rate of the carrier gas can be decreased, and abnormal electrical discharge can be suppressed.

During the plasma generation, the internal pressure of the chamber preferably exceeds 1 kPa, and more preferably is 3 to 30 kPa. If the internal pressure exceeds 1 kPa, the density of the silane-based raw material in plasma increases and deposition ratio of the film becomes fast, thus being preferable. Furthermore, preferably, the barrier gas is, for example, at least one gas selected from the group consisting of hydrogen gas, nitrogen gas, helium gas and argon gas.

In the silicon-based thin film depositing apparatus according to the present invention, a plurality of supporting electrodes may be provided in the chamber, and a plurality of counter electrodes may be provided so as to face the corresponding supporting electrodes. In such a structure, silicon-based thin films can be mass-produced. Furthermore, since the barrier gas flows so as to surround the raw material gas, even if the distance between the supporting electrodes and the corresponding counter electrodes is small, the flows of plasma generated by the individual pairs of electrodes or the flows of the raw material gas do not easily interfere with each other.

In the silicon-based thin film depositing apparatus according to the present invention, a DC pulse voltage application circuit may be provided for each pair of the supporting electrode and the counter electrode. In such a structure, plasma is easily generated uniformly compared with the case where one DC pulse voltage application circuit applies a DC pulse voltage to all the counter electrodes. Furthermore, a plurality of counter electrodes may be provided for the supporting electrode, and a DC pulse voltage application circuit may be provided for each of the counter electrodes.

In the silicon-based thin film depositing apparatus according to the present invention, the DC pulse voltage application circuit may include an inductor, a first semiconductor switch, and a second semiconductor switch that are connected in series between both terminals of a DC power supply unit, the inductor having a terminal connected to an anode terminal of the first semiconductor switch and another terminal connected to a gate terminal of the first semiconductor switch through a diode, the diode having an anode terminal connected to the gate terminal of the first semiconductor switch, in which inductive energy is stored in the inductor with an electrical connection of the first semiconductor switch that occurs when the second semiconductor switch is turned on, a pulse voltage is generated in the inductor with a turn-off of the first semiconductor switch that occurs when the second semiconductor switch is turned off, and the pulse voltage is raised and supplied to a coil element magnetically connected to the inductor. In such a structure, a DC pulse voltage that sharply rises can be applied between the electrodes.

The present invention also provides a silicon-based thin film depositing method in which the silicon-based thin film is deposited on a film forming portion using a silicon-based thin film depositing apparatus, the silicon-based thin film depositing apparatus including a supporting electrode which is provided in a chamber and capable of supporting the film formation portion, a counter electrode provided so as face the supporting electrode with a space therebetween, a DC pulse voltage application circuit which applies a DC pulse voltage between the counter electrode and the supporting electrode, a raw material gas injection orifice which injects a raw material gas for depositing the silicon-based thin film from a surface of the counter electrode toward the supporting electrode, and a barrier gas injection orifice which injects a barrier gas in the same direction as the direction in which the raw material gas is injected, so as to surround the raw material gas injected toward the supporting electrode from the surface of the counter electrode, the barrier gas being different from the raw material gas, the method including the steps of (a) supporting the film formation portion on the supporting electrode so that a space equal to or larger than a predetermined distance is formed between the surface of the film formation portion and the counter electrode; and (b) controlling the internal pressure of the chamber to a pressure of more than 1 kPa and applying a DC pulse voltage between the counter electrode and the supporting electrode by the DC pulse voltage application circuit to generate plasma while injecting the raw material gas from the raw material gas injection orifice and also injecting the barrier gas from the barrier gas injection orifice, so as to deposit the silicon-based thin film on the film formation portion.

In the silicon-based thin film depositing method, a DC pulse voltage is applied to perform discharge, and therefore, in comparison with the short pulse VHF PECVD method, even in a state where the distance between the electrodes is increased (e.g., to 5 mm or more), plasma can be generated efficiently, and the in-plane distribution of film thickness can be improved. Furthermore, by injecting the barrier gas so as to surround the raw material gas, plasma is prevented from diffusing in the lateral direction between the film formation portion and the counter electrode. Moreover, when a carrier gas, such as helium gas, is mixed with the raw material gas, the flow rate of the carrier gas can be decreased, and abnormal electrical discharge can be suppressed. In addition, since the internal pressure of the chamber is controlled to a pressure of more than 1 kPa when plasma is generated, the density of the silane-based raw material in plasma increases, and deposition ratio of the film becomes fast.

In the silicon-based thin film depositing method according to the present invention, in the silicon-based thin film depositing apparatus to be used, a plurality of supporting electrodes may be provided in the chamber, and a plurality of counter electrodes may be provided so as to face the corresponding supporting electrodes. In such a structure, silicon-based thin films can be mass-produced. Furthermore, since the barrier gas flows so as to surround the raw material gas, even if the distance between the supporting electrodes and the corresponding counter electrodes is small, the flows of plasma generated by the individual pairs of electrodes or the flows of the raw material gas do not easily interfere with each other.

In the silicon-based thin film depositing method according to the present invention, a DC pulse voltage application circuit may be provided for each pair of the supporting electrode and the counter electrode in the silicon-based thin film depositing apparatus. In such a structure, plasma is easily generated uniformly compared with the case where one DC pulse voltage application circuit applies a DC pulse voltage to all the counter electrodes. Furthermore, the DC pulse voltage application circuits can be individually controlled so that uniform silicon-based thin films are formed on the corresponding film formation portions.

In the silicon-based thin film depositing method according to the present invention, the DC pulse voltage application circuit may include an inductor, a first semiconductor switch, and a second semiconductor switch that are connected in series between both terminals of a DC power supply unit, the inductor having a terminal connected to an anode terminal of the first semiconductor switch and another terminal connected to a gate terminal of the first semiconductor switch through a diode, the diode having an anode terminal connected to the gate terminal of the first semiconductor switch, in which inductive energy is stored in the inductor with an electrical connection of the first semiconductor switch that occurs when the second semiconductor switch is turned on, a pulse voltage is generated in the inductor with a turn-off of the first semiconductor switch that occurs when the second semiconductor switch is turned off, and the pulse voltage is raised and supplied to a coil element magnetically connected to the inductor. In such a structure, a DC pulse voltage that sharply rises can be applied between the electrodes.

The silicon-based thin film depositing apparatus according to the present invention may include a temperature control mechanism which controls the temperature of the film formation portion, and the temperature control mechanism may be incorporated in the supporting electrode. The temperature control mechanism may be, for example, a heater, or a combination of a heater and a cooling fluid circulation path. Furthermore, the film formation portion may be disposed on a sheet base material. The sheet base material may be a glass base material or a flexible base material. Furthermore, the sheet base material may be designed such that it is introduced from outside the chamber by a transferring mechanism into the chamber, passed through the chamber, and then moved out of the chamber.

In the silicon-based thin film depositing method according to the present invention, the half width of the DC pulse voltage (i.e., time width at half-maximum pulse voltage) is preferably 3,000 nsec or less, and more preferably 100 to 1,000 nsec. Furthermore, with respect to the DC pulse voltage, the rise time is preferably one-third or less of the half width, the maximum voltage is preferably a negative voltage of 2 kV or more (in absolute value), the duty ratio is preferably 0.01% to 10%, and the power density is preferably 100 to 2,000 mW/cm$^2$. These values are about ten times larger than those in the case of ordinary PECVD. Furthermore, during the plasma generation, the pressure in the chamber is preferably 3 to 30 kPa.

DESCRIPTION OF THE PREFERRED EMBODIMENTS

Figure 1:
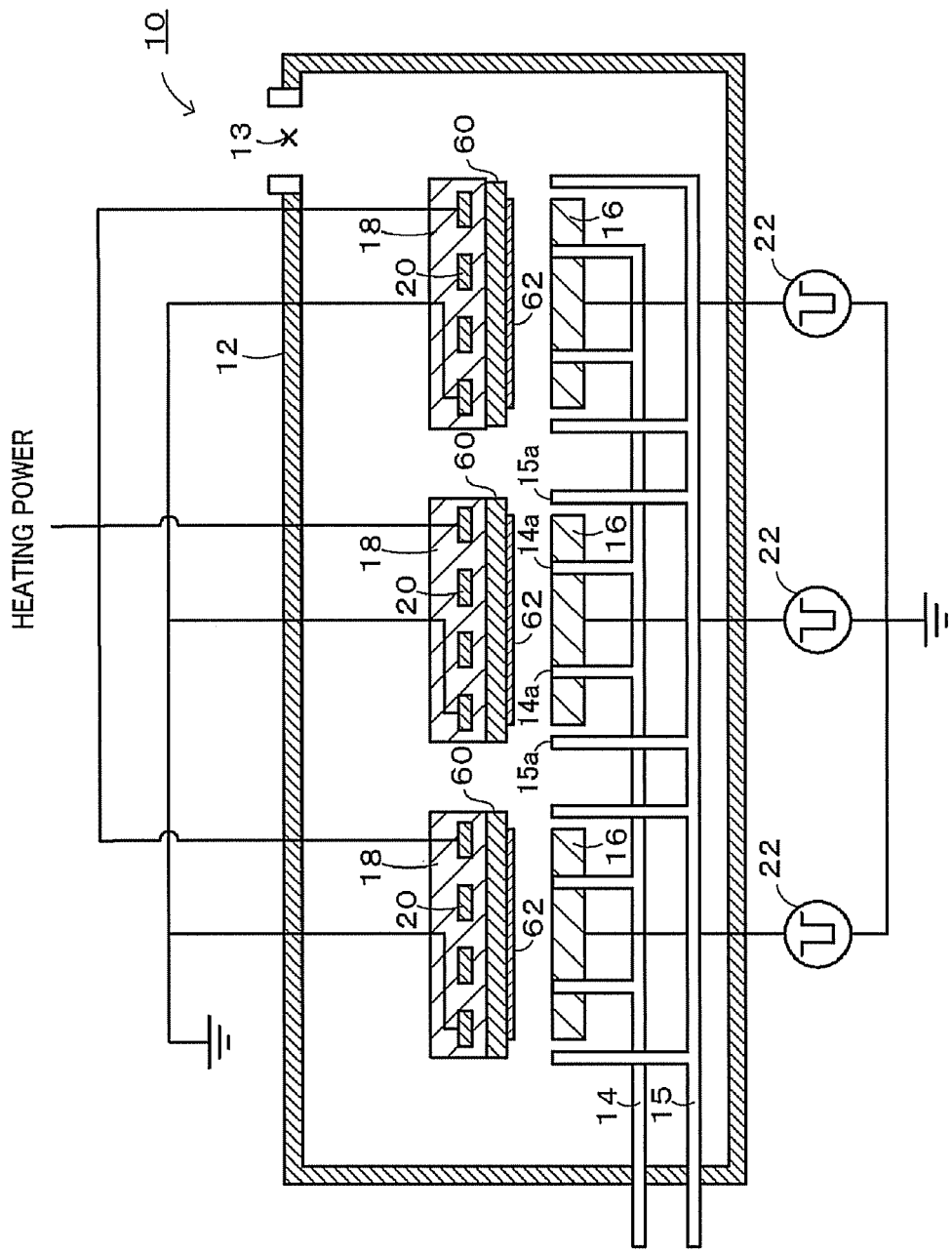
FIG. 1 is a schematic view showing a structure of a silicon-based thin film depositing apparatus 10.
Figure 2:
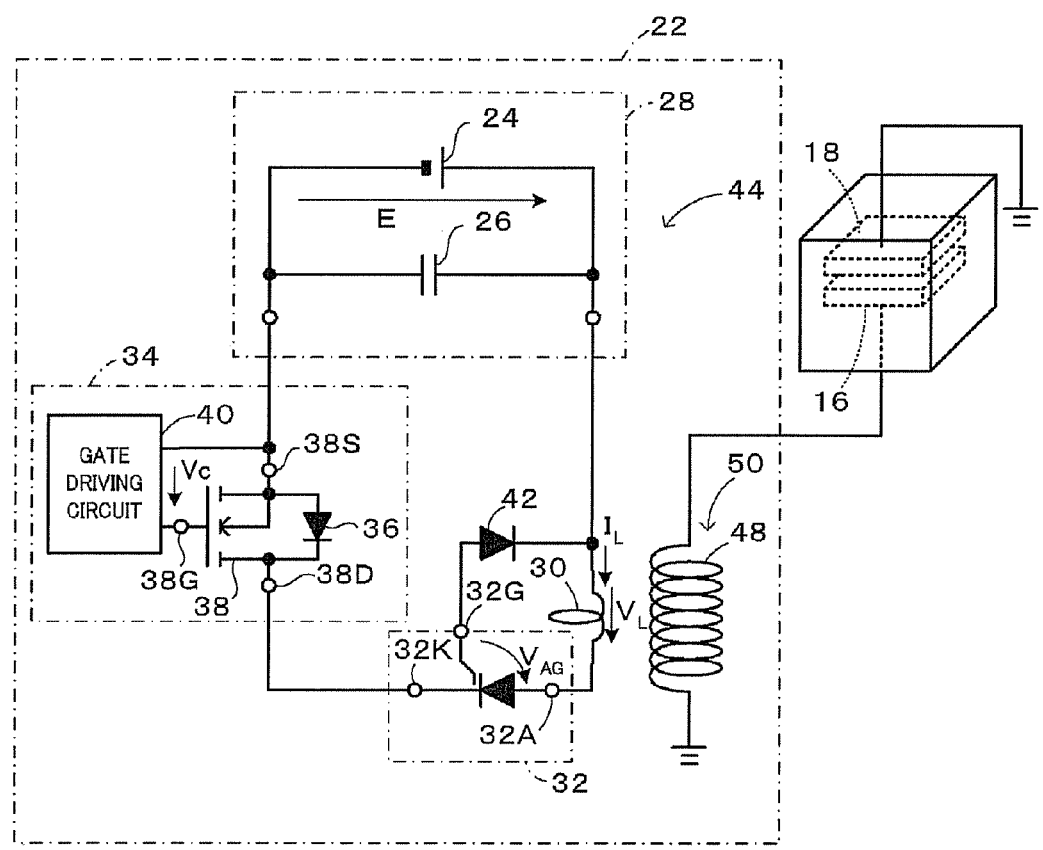
FIG. 2 is a schematic view of a DC pulse voltage application circuit 22.

Embodiments of the present invention will now be described with reference to the drawings. FIG. 1 is a schematic view showing a structure of a silicon-based thin film depositing apparatus 10, and FIG. 2 is a schematic view of a DC pulse voltage application circuit.

The silicon-based thin film depositing apparatus 10 is an apparatus which deposits a silicon-based thin film on each ITO (Indium Tin Oxide) transparent electrode 62 (film formation portion according to the present invention) on a sheet base material 60 composed of soda float glass. The sheet base material 60 can have a size of, for example, 1.4 m in length× 1.1 m in width×4 mm in thickness. The transparent electrode 62 can be composed of, for example, SnO$_2$, ZnO, or the like instead of ITO.

The silicon-based thin film depositing apparatus 10 includes a chamber 12 which is composed of stainless steel and connected to ground, a plurality of supporting electrodes 18 provided in the chamber 12, a plurality of counter electrodes 16 provided so as to face the corresponding supporting electrodes 18, and a DC pulse voltage application circuit 22 which applies a DC pulse voltage between each pair of the counter electrode 16 and the supporting electrode 18.

The chamber 12 is composed of a stainless steel plate material and box-shaped. The inside of the chamber 12 is a closed space, the pressure of which can be controlled. The chamber 12 includes a gas outlet 13 for controlling the internal pressure of the chamber 12 to a vacuum pressure, a raw material gas feed pipe 14 capable of feeding a raw material gas to the inside, and a barrier gas feed pipe 15 capable of feeding a barrier gas to the inside. Although not shown, the gas outlet 13 is connected to an oil rotary pump, and the internal pressure of the chamber 12 can be reduced to about 100 Pa. The raw material gas feed pipe 14 has a plurality of gas injection orifices 14a on the surface of the counter electrodes 16, and the raw material gas is injected from the gas injection orifices 14a toward the supporting electrodes 18.

Examples of the silicon-based thin film include amorphous silicon thin films and crystalline silicon thin films. Examples of the usable raw material gas for depositing amorphous silicon thin films or crystalline silicon thin films include SiH$_4$, Si$_2$H$_6$ and these silane-based gases to which any one of CH$_4$, C$_2$H$_2$, PH$_3$, B$_2$H$_6$, and GeH$_4$ is added. These raw material gases may be diluted with hydrogen, helium, argon, xenon, or the like. It is known that, depending on the type of the raw material gas, p-type, n-type, or i-type amorphous silicon thin films or crystalline silicon thin films may be deposited. For example, by addition of B$_2$H$_6$ to the silane-based gas, p-type is obtained, and by addition of PH$_3$, n-type is obtained. The barrier gas feed pipe 15 has a plurality of gas injection orifices 15a so as to surround the counter electrodes 16. The barrier gas is injected from the gas injection orifices 15a in the same direction as the direction in which the raw material gas is injected. The barrier gas is a gas different from the raw material gas, and, for example, at least one gas selected from the group consisting of hydrogen gas, nitrogen gas, helium gas, and argon gas.

Each of the supporting electrodes 18 is a stainless steel block, and configured to be capable of supporting the corresponding transparent electrode 62 at its lower surface. The transparent electrode 62 supported by the supporting electrode 18 is substantially parallel to the corresponding counter electrode 16. Furthermore, the supporting electrode 18 has a heater 20 and a built-in cooling fluid circulation path (not shown) inside. Heating by the heater 20 and cooling by the cooling fluid circulation path constitute a temperature control mechanism. By controlling the temperature control mechanism with a controller (not shown), the temperature of the transparent electrode 62 can be adjusted to a desired temperature (e.g., 200° C.). Each of the supporting electrodes 18 is connected to ground, and the potential thereof is at the ground level.

Each of the counter electrodes 16 is a plate material composed of stainless steel. The counter electrode 16 is disposed such that, when the sheet base material 60 provided with the transparent electrode 62 is supported by the supporting electrode 18, the counter electrode 16 is away from the surface of the transparent electrode 62 by a predetermined distance. The predetermined distance is set at 5 mm or more.

The DC pulse voltage application circuit 22 is provided for each counter electrode 16 so that a negative DC pulse voltage can be applied to the counter electrode 16. As shown in FIG. 2, the DC pulse voltage application circuit 22 includes a primary winding circuit 44 and a secondary winding circuit 50. The primary winding circuit 44 includes an inductor 30, a first semiconductor switch 32, and a second semiconductor switch 34 that are connected in series between both terminals of a DC power supply unit 28. The DC power supply unit 28 includes a DC power supply 24 and a capacitor 26 that lowers a high-frequency impedance. The secondary winding circuit 50 includes a coil element 48 having one terminal electrically connected to the counter electrode 16 and another terminal electrically connected to the ground. In the primary winding circuit 44, the inductor 30 has a terminal connected to an anode terminal 32A of the first semiconductor switch 32 and another terminal connected to a gate terminal 32G, which is a control terminal, of the first semiconductor switch 32 through a diode 42. The diode 42 has an anode connected to the gate terminal 32G of the first semiconductor switch 32. A device controlled by current, a self-turn-off device, or a commutation-turn-off device can be used as the first semiconductor switch 32. In this case, a static induction (SI) thyristor is used because it has a significantly large tolerance relative to a voltage build-up rate (dv/dt) when being turned off and also has a high voltage rating. A self-turn-off device or a commutation-turn-off device can be used as the second semiconductor switch 34. In this case, a power metal oxide semiconductor field-effect transistor (power MOSFET) 38 including an avalanche diode 36 in inverse-parallel connection is used. The second semiconductor switch 34 includes the power MOSFET 38 and a gate driving circuit 40 that is connected to a gate terminal 38G and a source terminal 38S of the power MOSFET 38 and that controls ON/OFF of an electric current flow between the source terminal 38S and a drain terminal 38D. The inductor 30 of the primary winding circuit 44 is a primary winding and the coil element 48 of the secondary winding circuit 50 is a secondary winding, both of which function as a transformer. A voltage of VAG×N2/N1 can be applied to both terminals of the coil element 48 in the secondary winding circuit 50, where N1 is the number of turns of the primary winding, N2 is the number of turns of the secondary winding, and VAG is a voltage between the anode and gate of the first semiconductor switch 32.

Figure 3:
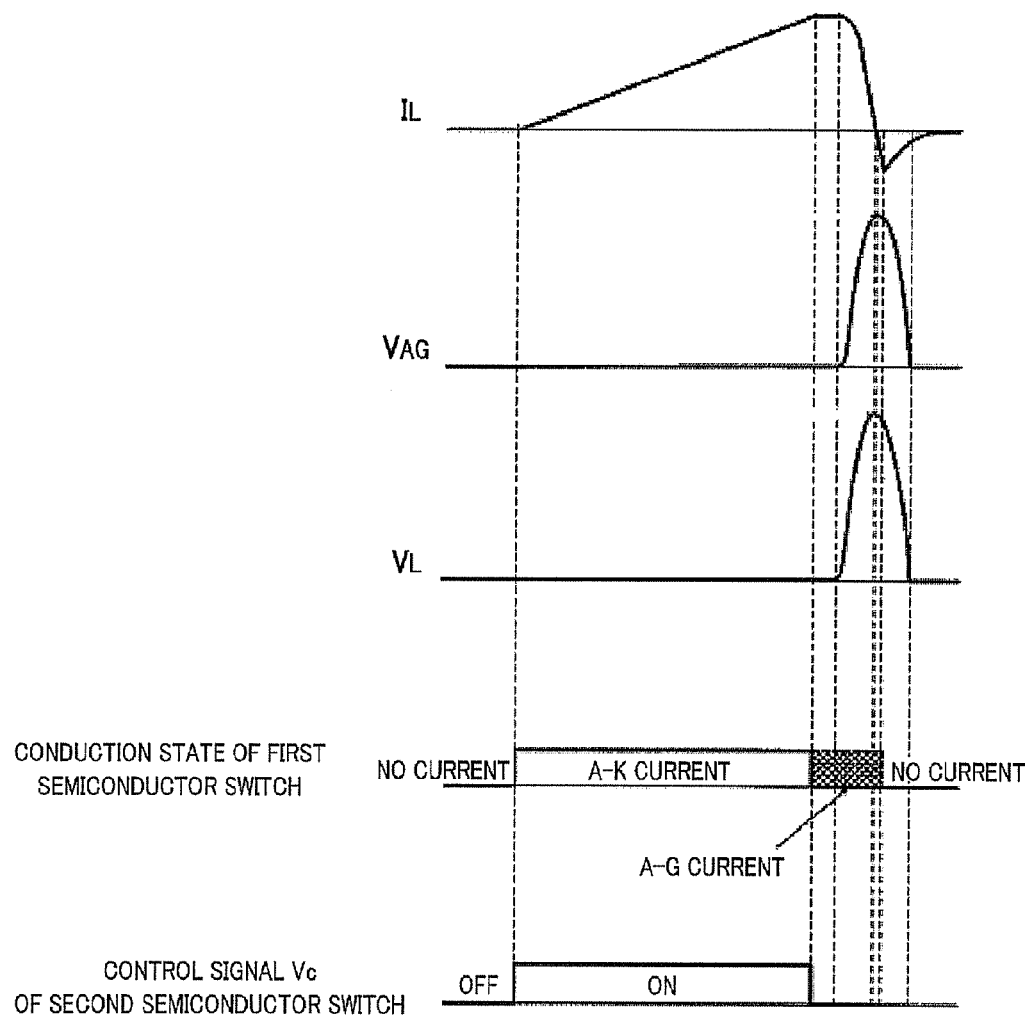
FIG. 3 is a schematic view showing an operation waveform of current and voltage of each part.

A pulse voltage generation mechanism in the primary winding circuit 44 of the silicon-based thin film depositing apparatus 10 will be described. When the gate driving circuit 40 supplies a control signal Vc between the gate and source of the power MOSFET 38, the power MOSFET 38 is turned on from an off state. At this point, the first semiconductor switch 32 is turned on by a field effect caused by applying a positive voltage between the gate terminal 32G and cathode terminal 32K thereof due to a significantly large impedance provided in opposite polarity by the diode 42. As a result, a current flows between the anode terminal 32A and the cathode terminal 32K (A-K current). When the first semiconductor switch 32 and the second semiconductor switch 34 are connected to allow current flow, a voltage, which is substantially the same as a voltage E of the DC power supply 24, is applied to the inductor 30, so that a desired amount of energy is stored. After the desired amount of energy is obtained, the gate driving circuit 40 stops supplying the control signal Vc to turn off the power MOSFET 38. At this time, a pulse voltage is generated at the inductor 30. Specifically, when the second semiconductor switch 34 is turned off, the current IL of the inductor 30 is commutated to the path from the anode terminal 32A of the first semiconductor switch 32 to the gate terminal 32G of the first semiconductor switch 32 to the anode of the diode 42 to the cathode of the diode 42, whereby a current flows between the anode terminal 32A and the gate terminal 32G (A-G current). A current due to the energy stored in the inductor 30 keeps flowing from the anode terminal 32A to the gate terminal 32G and the first semiconductor switch 32 shifts to an off state. Consequently, the voltage VAG between the anode and gate of the first semiconductor switch 32 and a voltage VL between the terminals of the inductor 30 sharply increase. When the current IL becomes nil, the voltages VAG and VL reach their peak. After that, when the first semiconductor switch 32 is turned off, the voltages VAG and VL sharply decrease. This is shown in FIG. 3. In FIG. 3, the current IL is a current that flows through the inductor 30, the voltage VAG is a voltage between the anode and gate of the first semiconductor switch 32, and the voltage VL is a voltage between the terminals of the inductor 30. The detailed mechanism of a pulse voltage is described in, for example, Japanese Patent No. 3811681.

Next, a case where a silicon-based thin film is formed on each transparent electrode 62 disposed on the corresponding sheet base material 60 using such a silicon-based thin film depositing apparatus 10 will be described. First, as shown in FIG. 1, a sheet base material 60 with a transparent electrode 62 is supported by the lower surface of each of the supporting electrodes 18. At this time, the surface of the transparent electrode 62 is away from the corresponding counter electrode 16 by a predetermined distance (5 mm or more). Furthermore, the temperature of the base material is set at 100° C. to 300° C. Subsequently, while injecting a raw material gas from the raw material gas injection orifices 14a of the raw material gas feed pipe 14 toward the supporting electrodes 18 and also injecting a barrier gas from the barrier gas injection orifices 15a of the barrier as feed pipe 15 in the same direction as the direction in which the raw material gas is injected, gas in the chamber 12 is discharged from the gas outlet 13 at a certain rate, and thereby, the pressure in the chamber 12 is controlled to a pressure of more than 1 kPa (e.g., 3 to 30 kPa). Then, by controlling the DC pulse voltage application circuits 22, a DC pulse voltage at a negative potential is applied to each counter electrode 16 such that the half width value is a predetermined period of time (in a range of 100 to 1,000 nsec), and a silicon-based thin film is deposited over several hours. At this time, the peak voltage of the DC pulse voltage is set at 2 kV or more (in absolute value), the duty ratio is set at 0.01% to 10%, the rise time is set at one-third or less of the pulse half width, and the power density is set at 100 to 2,000 mW/cm$^2$. The DC pulse voltage may be applied concurrently to the counter electrodes 16, or may be applied sequentially to the counter electrodes 16.

For example, in the case where an amorphous silicon thin film (thickness: several tenths of a micron meter) and a crystalline silicon thin film (thickness: several micron meters) are deposited on each transparent electrode 62, the internal pressure of the chamber 12 is set at 10 kPa. In the formation of the amorphous silicon thin film, a raw material gas composed of silane, hydrogen, and helium (100:0:100) (volume ratio) is injected from the gas injection orifices 14a and also a barrier gas composed of argon is injected from the gas injection orifices 15a in an amount of 300% by volume relative to the raw material gas. The film deposition conditions are as follows: base temperature 150° C., half width of DC pulse voltage: 200 nsec, rise time: 50 nsec, peak voltage: 18 kV, duty ratio: 1%, and power density: 100 mW/cm$^2$. In the subsequent deposition of the crystalline silicon thin film, the film is deposited as in the condition of the amorphous silicon thin film except that a raw material gas composed of silane, hydrogen, and helium (5:100:20) (volume ratio) is injected from the gas injection orifices 14a, a barrier gas composed of argon is injected from the gas injection orifices 15a in an amount of 500% by volume relative to the raw material gas, the base temperature is set at 200° C., the duty ratio is set at 5%, and the power density is set at 300 mW/cm$^2$. By using such a method, the film deposition ratio for the amorphous silicon thin film and the crystalline silicon thin film is several hundred nanometers per minute. In tandem solar cells using a stacked structure including the amorphous silicon thin films and crystalline silicon thin films obtained as described above, the same conversion efficiency as that obtained by the existing method can be obtained.

In the silicon-based thin film depositing apparatus 10 according to this embodiment, since the short pulse VHF PECVD method, plasma can be generated efficiently even in a state where the distance between the electrodes is increased (e.g., to 5 mm or more) in comparison with the method in which a high frequency voltage is intermittently applied to perform discharge, and the in-plane distribution of film thickness can be improved. Furthermore, by injecting the barrier gas so as to surround the raw material gas, plasma is prevented from diffusing in the lateral direction between the transparent electrode 62 and the counter electrode 16. Moreover, when a carrier gas, such as helium gas, is mixed with the raw material gas, the flow rate of the carrier gas can be decreased, and abnormal electrical discharge can be suppressed. In addition, since the internal pressure of the chamber is controlled to a pressure of more than 1 kPa when plasma is generated, the density of the silane-based raw material in plasma increases, and the film deposition ratio becomes fast.

Furthermore, silicon-based thin films can be mass-produced. Moreover, since the barrier gas flows so as to surround the raw material gas, even if the distance between the supporting electrodes 18 and the corresponding counter electrodes 16 is small, the flows of plasma generated by the individual pairs of electrodes or the flows of the raw material gas do not easily interfere with each other.

Furthermore, since a DC pulse voltage application circuit 22 is provided for each counter electrode 16, plasma is easily generated uniformly compared with the case where one DC pulse voltage application circuit applies a DC pulse voltage to all the counter electrodes. Furthermore, the DC pulse voltage application circuits can be individually controlled so that a uniform silicon-based thin film is deposited on each film formation portion.

Obviously, the present invention is not limited to the embodiment described above and various modifications can be made within the technical scope of the present invention.

Figure 4:
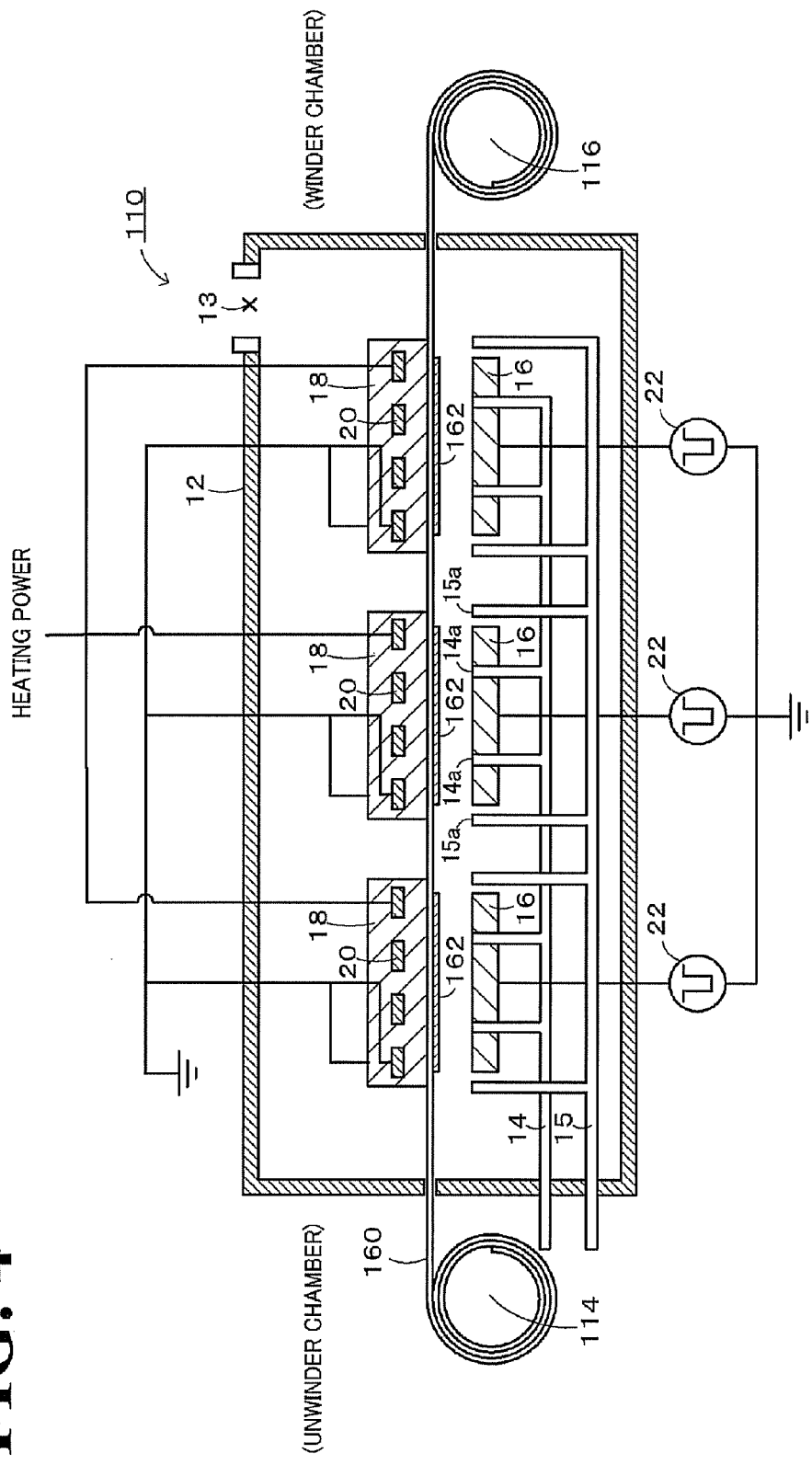
FIG. 4 is a schematic view showing a structure of a silicon-based thin film depositing apparatus 110.

In the embodiment described above, a silicon-based thin film is deposited on the ITO transparent electrode 62 on the sheet base material 60 composed of soda float glass. A silicon-based thin film may be deposited on a metal electrode on a flexible sheet base material. FIG. 4 is a schematic view showing a silicon-based thin film depositing apparatus 110 in the case where a silicon-based thin film is deposited on each silver electrode 162 (film forming portion according to the present invention) deposited by sputtering on a sheet base material 160 composed of a flexible polyimide resin. The sheet base material 160 to be used has the size of about 1,000 mm in width and about 100 μm in thickness. With respect to the silicon-based thin film depositing apparatus 110, the same reference numerals are used to represent the same components as those in the silicon-based thin film depositing apparatus 10, and a description thereof will be omitted. The silicon-based thin film depositing apparatus 110 includes a chamber 12, an unwinder chamber provided on the left side of the chamber 12, and a winder chamber provided on the right side of the chamber 12. The unwinder chamber contains an unwinder roll 114 around which the sheet base material 160 before deposition of the silicon-based thin film is wound. The winder chamber contains a winder roll 116 around which the sheet base material 160 after deposition of the silicon-based thin film is wound. The sheet base material 160 is introduced from the unwinder roll 114 into the chamber 12 and rewound by the winder roll 116 while abutting against the lower surface of each supporting electrode 18. In this case, each silver electrode 162 on the sheet base material 160 is arranged so as to face the corresponding counter electrode 16. In such a state, while injecting a raw material gas from the raw material gas injection orifices 14a of the raw material gas feed pipe 14 toward the supporting electrodes 18 and also injecting a barrier gas from the barrier gas injection orifices 15a of the barrier gas feed pipe 15 in the same direction as the direction in which the raw material gas is injected, the gases are discharged from the gas outlet 13 at a certain rate, and thereby, the pressure in the chamber 12 is controlled to a pressure of more than 1 kPa (e.g., 3 to 30 kPa). Then, by controlling the DC pulse voltage application circuit 22, a DC pulse voltage is applied to each counter electrode 16 to generate plasma. Thereby, a silicon-based thin film is deposited on each silver electrode 162 on the sheet base material 160. After the deposition of the silicon-based thin film, the sheet base material 160 is rewound by the winder roll 116 by means of a transfer roller (not shown). The plasma generation conditions are the same as those in the embodiment described above. In this method, it is also possible to obtain the same advantage as that in the embodiment described above.

In the embodiment described above, a counter electrode 16 may be divided into a plurality of electrodes in the horizontal direction and in the depth direction, and a DC pulse voltage application circuit 22 may be provided on each of the resulting electrodes. In such a method, plasma is more easily uniformly generated.

In the embodiment described above, the DC pulse voltage application circuit 22 is constituted by the primary winding circuit 44 and the secondary winding circuit 50. However, instead of the inductor 30, a coil element 48 may be electrically connected. In such a case, the pulse voltage generated in the coil element 48 is directly applied to the counter electrode 16.

In the embodiment described above, an opening type circuit is employed as the primary winding circuit 44, in which, a pulse voltage is generated when the first and second semiconductor switches 32 and 34 are turned off. However, a closing type circuit may be employed, in which a pulse voltage is generated when the switches are turned on.

The present application claims priority from Japanese Patent Application No. 2008-091402 filed on Mar. 31, 2008, the entire contents of which are incorporated herein by reference.

What is claimed is:

1. A silicon-based thin film depositing method in which a silicon-based thin film is deposited on a film forming portion using a silicon-based thin film depositing apparatus, the silicon-based thin film depositing apparatus including a supporting electrode which is provided in a chamber and capable of supporting the film formation portion, a counter electrode provided so as to face the supporting electrode with a space therebetween, a DC pulse voltage application circuit which applies a DC pulse voltage between the counter electrode and the supporting electrode, a raw material gas injection orifice which injects a raw material gas for depositing the silicon-based thin film from a surface of the counter electrode toward the supporting electrode, and a barrier gas injection orifice which injects a barrier gas in the same direction as the direction in which the raw material gas is injected, so as to surround the raw material gas injected toward the supporting electrode from the surface of the counter electrode, the barrier gas being different from the raw material gas, the method comprising the steps of:

(a) supporting the film formation portion on the supporting electrode such that a space equal to or larger than a predetermined distance is formed between the surface of the film formation portion and the counter electrode; and (b) controlling the internal pressure of the chamber to a pressure of more than 1 kPa and applying a DC pulse voltage between the counter electrode and the supporting electrode by the DC pulse voltage application circuit to generate plasma while injecting the raw material gas from the raw material gas injection orifice and also injecting the barrier gas from the barrier gas injection orifice, so as to deposit the silicon-based thin film on the film formation portion.

2. The silicon-based thin film depositing method according to claim 1, wherein, in the silicon-based thin film depositing apparatus, a plurality of supporting electrodes are provided in the chamber, and a plurality of counter electrodes are provided so as to face the corresponding supporting electrodes.

3. The silicon-based thin film depositing method according to claim 2, wherein, in the silicon-based thin film depositing apparatus, the DC pulse voltage application circuit is provided for each pair of the supporting electrode and the counter electrode.

4. The silicon-based thin film depositing method according to claim 1, wherein the DC pulse voltage application circuit includes an inductor, a first semiconductor switch, and a second semiconductor switch that are connected in series between both terminals of a DC power supply unit, the inductor having a terminal connected to an anode terminal of the first semiconductor switch and another terminal connected to a gate terminal of the first semiconductor switch through a diode, the diode having an anode terminal connected to the gate terminal of the first semiconductor switch, wherein inductive energy is stored in the inductor with an electrical connection of the first semiconductor switch that occurs when the second semiconductor switch is turned on; a pulse voltage is generated in the inductor with a turn-off of the first semiconductor switch that occurs when the second semiconductor switch is turned off; and the pulse voltage is raised and supplied to a coil element magnetically connected to the inductor.

* * * * *